United States Patent [19]
Fournel et al.

[11] Patent Number: 5,944,846
[45] Date of Patent: Aug. 31, 1999

[54] METHOD AND APPARATUS FOR SELECTIVELY TESTING IDENTICAL PINS OF A PLURALITY OF ELECTRONIC COMPONENTS

[75] Inventors: Jean-Claude Fournel, Saint-Victor Malescours; Daniel Chausse, Saint-Etienne; Jean-Louis Murgue, Saint-Romain-les-Atheux, all of France

[73] Assignee: Schlumberger Industries, Montrouge, France

[21] Appl. No.: 08/930,490

[22] PCT Filed: Apr. 10, 1996

[86] PCT No.: PCT/FR96/00539

§ 371 Date: Sep. 30, 1997

§ 102(e) Date: Sep. 30, 1997

[87] PCT Pub. No.: WO96/33460

PCT Pub. Date: Oct. 24, 1996

[30] Foreign Application Priority Data

Apr. 19, 1995 [FR] France .................................. 95/04777

[51] Int. Cl.$^6$ ...................................................... G01R 31/28
[52] U.S. Cl. ........................................................... 714/724
[58] Field of Search .................................. 714/724, 731, 714/733, 734, 738; 324/158.1, 73.1

[56] References Cited

U.S. PATENT DOCUMENTS

| | | | |
|---|---|---|---|
| 4,730,318 | 3/1988 | Bogholtz, Jr. et al. ................. | 714/738 |
| 4,914,379 | 4/1990 | Maeno ................................... | 371/22.3 |
| 4,972,413 | 11/1990 | Littlebury et al. ..................... | 371/22.1 |
| 4,989,209 | 1/1991 | Littlebury et al. ..................... | 371/22.1 |
| 5,225,772 | 7/1993 | Cheung et al. ........................ | 324/158.1 |

*Primary Examiner*—Hoa T. Nguyen
*Attorney, Agent, or Firm*—Frishauf, Holtz, Goodman, Langer & Chick

[57] ABSTRACT

Apparatus for selectively testing, in parallel, identical pins of a plurality of electronic components is provided. The apparatus enables selective pins of selective electronic components to be disabled during testing so that testing can continue in connection with the identical pins of the remainder of the plurality of electronic components.

6 Claims, 2 Drawing Sheets

METHOD AND APPARATUS FOR SELECTIVELY TESTING IDENTICAL PINS OF A PLURALITY OF ELECTRONIC COMPONENTS

FIELD OF THE INVENTION

The present invention concerns equipment for automatically testing electronic components in parallel.

BACKGROUND OF THE INVENTION

Most digital electronic components sold are tested by their manufacturer several times before being shipped.

Component testers have two functions: firstly, generating digital signals, at logic 0 or logic 1, for example, and, secondly, verifying the presence of output transitions by comparison with a pre-established test table. The timing and the level of the signals generated and the signals compared are programmable. As a general rule, a component tester must generate and/or compare signals simultaneously at all the functional pins of the component under test.

The definition of the signals to be generated and/or compared is usually extremely complex. Testing a microprocessor can entail strings of several million 0 or 1 bits in the same sequence. To define the signals, the concept of period is used to determine a time band within which a simpler signal is defined. This signal is decomposed into timing data, also known as a time marker, and an event, for example a transition.

A functional test is therefore executed by scanning a test programming memory in which each line corresponds to a period and the content of which represents timing and event data defining the signal within the period for each pin. The timing and event data is complemented by, among other things, an instruction which controls the scanning of the test programming memory. This instruction is common to all of the functional pins of the circuit under test. The most common instruction is that to read the next line (instruction INC).

This architecture based on scanning a memory is deterministic in the sense that it assumes that it is possible to know a priori exactly what will happen at a given time at the pins of the electronic circuit under test.

A logic component tester has various parts:

a programming system and a programming main memory, a test circuit for each pin including a system for generating stimuli, i.e. forcing signals, which must be applied to the pin in question and a system for comparing response signals from the component, one or more interface systems, measurement heads, for adapting the stimuli to the constraints of the component to be verified.

The number of stimuli generators/comparators can be between 32 and 1 024; in the present context there is a limit of 256 generators/comparators. There can be two measurement heads, for example, each including 256 adapters.

To optimize the cost of the test and the surface area occupied by the tester, it is possible to combine identical pins of the components of a plurality of heads to form a single group connected to the same test circuit, i.e. to the same stimuli generation/comparison system. Multiplexers (one per signal and per pin) at the output of the generation/comparison part generally route the signals to one head or the other. Accordingly, one component is tested on head No.1 while another component is being manipulated on head No.2, and vice versa. This increases the capacity of the tester by adding one head. Typically, adding a head doubles the capacity of the tester if the test time is identical to the manipulation time.

In the case of identical components, testers with two heads used simultaneously have been proposed in which the same stimuli are generated in parallel at both heads. Likewise, the received response signals are compared with a table simultaneously by different circuits. The tester then generates two results: that from head No.1 and that from head No.2. Accordingly, the capacity of the tester is actually doubled, simply by duplicating the generation circuits and the table comparison circuits, given that the table is the same for head No.1 as for head No.2, since the signals generated and the components under test are identical.

Parallel testing therefore enables n components to be tested simultaneously in a similar way to testing a single component. The simultaneous testing can of course be done on the same head or on more than one head. The present invention is addressed to both of these alternatives.

In practice, electronic components are tested in parallel, in a manner that is known in itself, by means of test circuits, each of these circuits testing the pins of groups of identical pins of said components.

The generation system of the test circuit generally includes two forcing circuits adapted to apply stimuli, i.e. forcing signals, to identical pins of the components under test, said forcing signals being formed by two timing generators controlled by the test programming main memory.

The comparison system includes two comparator circuits receiving from the pins response signals to the forcing signals, said response signals being compared to reference signals supplied by two other timing generators from a table supplied by the test programming memory.

In the remainder of this specification, the expression test signal is used non-specifically to refer to a forcing signal or to a response signal.

With test circuits which test groups of pins, the pins of one component are in one-to-one correspondence with the same pins of the other component. This particular method of parallel testing, in which identical pins are forced and compared synchronously, is well-suited to the commonest case of components whose operation is totally known and identical from one component to another.

U.S. Pat. No. 4,594,544 describes means for simultaneously enabling pins of a group of identical pins of the components under test, to enable said identical pins to receive the same test programming data at the same time. This avoids the specific sequential addressing of individual pins that has previously led to a great deal of time being wasted during which the test equipment was not available.

However, it may be necessary to eliminate from the test a given pin of a group of identical pins belonging to a particular electronic component under test, for various reasons, for example an electrical continuity fault.

SUMMARY OF THE INVENTION

It is with the aim of meeting this requirement that the present invention proposes equipment for automatically testing electronic components in parallel in groups constituted of identical pins of all of said electronic components, said equipment including:

a main memory containing test programming data for each group of identical pins, said data being conveyed by respective data buses, test programming enabling means for each group of identical pins, and at least one test circuit associated with each group of identical pins adapted to receive said test programming data from the main memory and to apply it to the pins of said group of identical pins, noteworthy in that said equipment also includes test programming enabling means for each pin of the same group of identical pins.

Accordingly, it is possible to activate globally a group of identical pins of the components under test by using group enabling means described with reference to the aforementioned American patent, while having the facility to eliminate from the test one or possibly more pins, identified as defective pins, for example, by using pin enabling means of the test equipment of the invention.

In one particular embodiment of the invention, said test programming enabling means for a group of identical pins comprising a group enabling circuit controlled by a group enabling instruction, said test programming enabling means for each pin of said group comprise a pin enabling circuit in series with the group enabling circuit on the corresponding data bus and controlled by a pin enabling instruction.

An advantageous feature of the invention enabling the use of this embodiment is that said pin enabling circuit includes a circuit for transmitting test programming data for the corresponding pin, controlled by a control signal representative of the pin enabling instruction.

It is even possible to combine the two types of enabling if, in accordance with the invention, said control signal is also representative of the group enabling instruction.

The following description with reference to the accompanying drawings, given by way of non-limiting example, shows clearly in what the invention consists and how it can be put into practice.

DETAILED DESCRIPTION OF THE PREFERRED EMBODIMENTS

Figure 2:
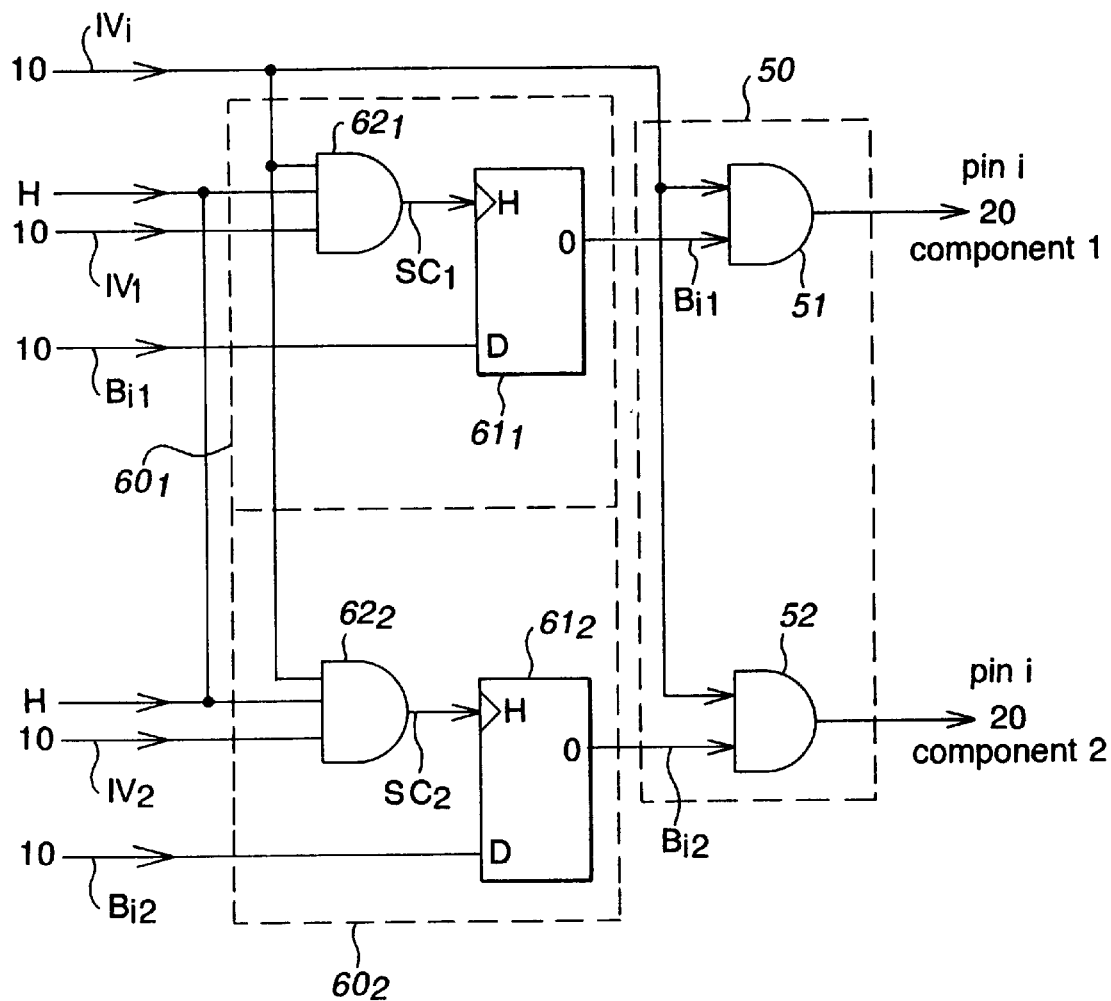
FIG. 2 is a schematic diagram of an enabling circuit of test equipment in accordance with the invention.

The parallel test equipment shown diagrammatically in FIG. 2 is described in detail in French Patent Application No. 94 15559; only the components essential to an understanding of the present invention will be referred to in the remainder of this description.

The test programming memory or main memory 10 contains the instructions for executing the test functional sequence.

Each address 12 of the main memory 10 defines:

an instruction 14 that is common to all of the pins under test and controls the scanning of the main memory. CALLM and RPTM are instructions calling the phase synchronization sequence. When these instructions are invoked, the phase synchronization circuit is activated and therefore controls the scanning of the main memory 10 or of subroutines. The instruction RPTM executes the same line until the phase is synchronized. The instruction CALLM executes a series of instructions until the phase is synchronized. Thus the instruction CALLM loops the memory. The instruction INC merely goes to the next line, the definition 16 of the type of timing to use during the execution of the contents of this memory address. The timing type is common to all the pins of the tester and corresponds to the address of a memory location specific to each pin in which the time value corresponding to that address is defined. This time definition architecture corresponds to the "pin sequencer" architecture that is the subject matter of U.S. Pat. No. 5,212,443, a table 18 that corresponds to the logic content (0 or 1, for example) of the signals to be sent or to be compared. This table is specific to each pin. The tester receives from the component under test response signals that it compares with data from the table 18.

The test programming main memory 10 defines the signal to be generated for each pin. A signal generation or comparison function, identical for each pin, is therefore defined which generates the stimuli (i.e. forcing signals) from data in the memory 10 and receives response signals to be compared with data from the table 18.

This is effected by means of identical test circuits 20, each circuit being assigned to one pin and comprising a set 22 of timing generators controlling in parallel, firstly, a forcing circuit 24 (event generator) sending forcing signals to components on two heads or components 1 and 2, for example, and, secondly, a comparator circuit 26 receiving response signals from the heads or components 1 and 2 and comparing these signals with the data in the table 18.

The set 22 of timing generators defines the times at which forcing signal fronts must be generated, the times at which comparison of the response signals with table 18 must commence and the times at which comparison must cease. When the comparator circuit 26 effects a comparison, it generates a result, either conformance or non-conformance with the table. This result is specific to each pin and to each component on which comparisons are effected. In FIG. 2, this result is indicated "resu 1" for head 1 and "resu 2" for head 2. It is possible to discover if the set conforms or not by applying the "or" logic operator to all of the pins by means of OR gates 28 and 30 for head 1 and head 2, respectively.

Figure 1:
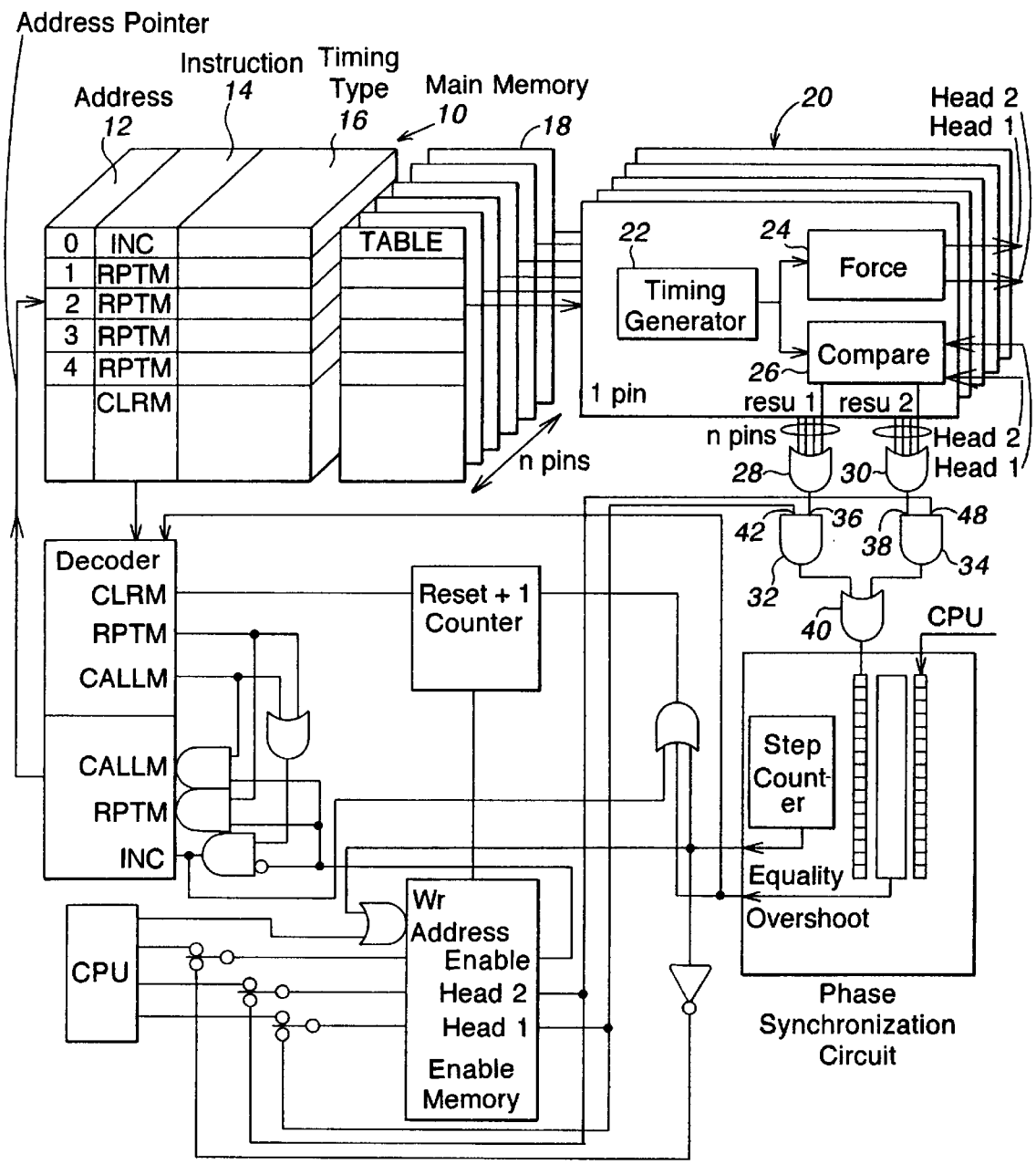
FIG. 1 is a general schematic diagram of equipment for testing electronic components in parallel.

The block schematic from FIG. 1 of parallel test equipment can be complemented, as shown in FIG. 2, by test programming enabling means for each group of identical pins. There is shown here only one group of identical pins i of two components 1 and 2. Rather than two components, there could equally well be two measuring heads each grouping a plurality of components.

These means for enabling a group of pins i are described in detail, under the name of "participate register" in U.S. Pat. No. 4,594,544. In outline, firstly, said group enabling means are disposed on the buses $B_{i1}$, $B_{i2}$ carrying test programming data from the main memory 10 and, secondly, they essentially comprise a group enabling circuit 50 between said main memory 10 and the test circuit 20 and a group enabling instruction $IV_i$.

In the FIG. 2 schematic, the group enabling circuit 50 essentially comprises AND gates $50_1$, $50_2$, one for each pin in the group, each of these AND gates receiving at a first input the programming data from the corresponding buses $B_{i1}$, $B_{i2}$ and at a second input the common group enabling instruction $IV_i$. If the instruction $IV_i$ enables the group by means of 1 bit, the test programming data for the group will be globally transmitted by all the AND gates 51, 52 to the test circuit 20. On the other hand, if the instruction $IV_i$ disables the entire group by means of a 0 bit, all the pins i will be eliminated from the test.

To be able to disable only one pin, for example, while having enabled the group by a 1 bit on $IV_i$, the FIG. 2 circuit provides test programming enabling means for each pin of the same group of identical pins i.

As shown in the FIG. 2 embodiment, said enabling means for each pin of the group comprise a pin enabling circuit $60_1$, $60_2$ in series with the group enabling circuit 50 on the corresponding data bus $B_{i1}$, $B_{i2}$, said pin enabling circuit being . . . by a pin enabling instruction $IV_1$, $IV_2$.

The pin enabling circuits $60_1$, $60_2$ of FIG. 2 include a circuit $61_1$, $61_2$ for transmitting the test programming data for the corresponding pin, in this example a D-type flip-flop controlled by a control signal $SC_1$, $SC_2$ representative of the pin enabling instruction $IV_1$, $IV_2$, in the sense that if a pin is not enabled following a 0 bit pin enabling instruction, for example, the control signal then also takes a 0 bit value, so disabling the D-type flip-flop and the transmission of programming data for that pin.

This is the outcome if, for example, the control signal $SC_1$, $SC_2$ is supplied by an AND gate $62_1$, $62_2$ to which the pin enabling instruction $IV_1$, $IV_2$ is applied and a clock signal H required for the operation of the D-type flip-flop $61_1$, $61_2$.

Of course, the group enabling instruction $IV_i$ can be applied to the input of all the AND gates $62_1$, $62_2$, the effect of which is to neutralize all the group enabling circuits $60_1$, $61_2$ if said group of identical pins i is disabled.

On the other hand, even if the group as a whole is enabled, it will always be possible to eliminate a given pin by applying a 0 bit pin enabling instruction $IV_1$ or $IV_2$ to the corresponding pin enabling circuit $60_1$, or $60_2$, without affecting the other pins.

We claim:

1. Apparatus for automatically testing a plurality of electronic components in parallel, the plurality of electronic components having a plurality of groups of pins, each group having a plurality of identical pins from said respective components, said apparatus comprising:

a main memory (10) storing test programming data for each of the plurality of groups of pins, and data buses ($B_{i1}$, $B_{i2}$) to apply the test programming data from said main memory to each of the plurality of groups of pins;

a plurality of group enabling circuits ($IV_i$, 50) respectively operatively coupled to the plurality of groups of pins;

a plurality of pin enabling circuits ($60_1$; $60_2$) for each of said plurality of groups of pins, and coupled, respectively, to the plurality of identical pins;

a plurality of test circuits (20) respectively coupled to the plurality of groups of identical pins, each of the plurality of test circuits receiving the test programming data from the main memory (10) and applying the test programming data to all pins of a respective group of identical pins when its respective group enabling circuit is enabled, but not to those specific pins of said respective group of identical pins which have their respective pin enabling circuits disabled.

2. Apparatus according to claim 1, wherein each of said plurality of group enabling circuits (50) receive and is controlled by a group enabling instruction signal ($IV_i$), and wherein each of said plurality of pin enabling circuits ($60_1$; $60_2$) is in series with a respective one of the plurality of group enabling circuits (50) and receives and is controlled by a pin enabling instruction signal ($IV_1 IV_2$).

3. Apparatus according to claim 2 wherein each of said plurality of pin enabling circuits ($60_1$; $60_2$) includes a circuit ($60_1$; $60_2$) for transmitting test programming data for the corresponding pin, controlled by a control signal ($SC_1$; $SC_2$) representative of the pin enabling instruction signal ($IV_1$, $IV_2$).

4. Apparatus according to claim 3 wherein said control signal ($SC_1$ $SC_2$) is also representative of the group enabling instruction signal ($IV_i$).

5. Apparatus according to claim 3 wherein said circuit for transmitting test programming data is a D-type flip-flop ($60_1$; $60_2$) and wherein said control signal ($SC_1$; $SC_2$) is supplied by an AND gate ($62_1$; $62_2$) to which said pin enabling instruction signal ($V_1$; $IV_2$) is applied.

6. Apparatus according to claim 3, wherein said control signal ($SC_1$; $SC_2$) is also representative of the group enabling instruction signal ($IV_i$), said circuit for transmitting test programming data is a D-type flip-flop ($61_1$; $61_2$), said control signal ($SC_1$; $SC_2$) is supplied by an AND gate ($62_1$; $62_2$) to which said pin enabling instruction signal ($IV_1$; $IV_2$) is applied, and wherein the group enabling instruction signal ($IV_i$) is also applied to an input of said AND gate ($62_1$; $62_2$).

* * * * *